United States Patent

Lee

Patent Number: 5,909,383
Date of Patent: Jun. 1, 1999

[54] DECIMATION FILTER

[75] Inventor: Sang Cheol Lee, Kyonggi-do, Rep. of Korea

[73] Assignee: Hyundai Electronics Industries Co., Ltd., Kyoungki-do, Rep. of Korea

[21] Appl. No.: 08/967,094

[22] Filed: Nov. 10, 1997

[30] Foreign Application Priority Data

Dec. 27, 1996 [KR] Rep. of Korea .................. 1996/73630

[51] Int. Cl.⁶ ........................................................... G06F 17/10
[52] U.S. Cl. ..................................... 364/724.1; 364/724.16
[58] Field of Search .......................... 364/724.011, 724.1, 364/724.16, 724.17; 341/143; 375/350

[56] References Cited

U.S. PATENT DOCUMENTS

| | | | |
|---|---|---|---|
| 5,170,368 | 12/1992 | Hattori | 364/724.1 |
| 5,301,134 | 4/1994 | Maruyama | 364/724.1 |
| 5,479,454 | 12/1995 | Greggain et al. | 375/350 |
| 5,500,811 | 3/1996 | Corry | 364/724.16 |
| 5,831,880 | 11/1998 | Lee | 364/724.06 |
| 5,838,600 | 11/1998 | McNeely et al. | 364/724.16 X |

*Primary Examiner*—Hassan Kizou
*Assistant Examiner*—Douglas S. Lee
*Attorney, Agent, or Firm*—McAulay Nissen Goldberg Kiel & Hand, LLP

[57] ABSTRACT

A decimation filter is disclosed. A first adder receives a digital video x(n) signal as its two input signals, adds the two input signals, and outputs a signal 2x(n). A delay delays digital video signal x(n) by one period, and sends the delayed signal to a second adder. The second adder adds digital video signal x(n−1), delayed by the delay by one period, to digital video signal x(n), and outputs the added signal to a third adder. The third adder adds output signal 2x(n) of the first adder to output signal x(n)+x(n−1) of the second adder, and sends resultant signal 3x(n)+x(n−1) to a bit shifter. The bit shifter shifts signal 3x(n)+x(n−1) output from the third adder by two bits to the right, and divides the shifted signal by $2^2$, producing a signal y(n)={3 x(n)+x(n−1)}/4.

7 Claims, 7 Drawing Sheets

× Luminance Signal
○ Chrominance Signal

DECIMATION FILTER

BACKGROUND OF THE INVENTION

1. Field of the Invention

The present invention relates to a decimation filter, specifically, to a decimation filter in which a 2-stage finite impulse response (FIR) filter used to convert a 4:2:2 formatted video signal into a 4:2:0 formatted video signal using a configuration of adders without using of a multiplier.

2. Discussion of Related Art

The format of digital motion pictures for HDTV has been established by the Society of Motion Picture and Television Engineers (SMPTE) standard 260M. "Luminance" expresses the degree of brightness of a picture, and the luminance of one picture element is represented by eight bits. "Chrominance" is information expressing the color of a picture, and it represents the color of a picture element using two eight-bit variables. The sampling frequency ratio indicates the ratio of three components, luminance information Y and chrominance information Cb and Cr, which are included in a scanning line of TV picture to one another. For example, 4:2:0, 4:2:2 and 4:4:4 indicate the sampling frequency ratios of a luminance signal Y and two chrominance signals Cb and Cr. In case of 4:2:0, 4:2:0 and 4:0:2 are alternately shown on odd and even scanning lines, thus one of ratios, 4:2:0 for example, is representative of the ratio.

Though 24-bit information is, conventionally, assigned to one picture element, chrominance information can be reduced because human eyes are not sensitive to colors. 4:4:4 indicates that the chrominance information is not reduced, 4:2:2 indicates that the information is reduced in the horizontal direction, and 4:2:0 indicates that the information is reduced in the horizontal and vertical directions. In 4:2:0 format, chrominance information Cb and Cr are sampled at half the frequency of luminance information Y in the horizontal and vertical directions. That is, two lines are alternately repeated, one of those having Y sampled at 13.5 MHz, Cb sampled at 6.75 MHz and Cr not being sampled, the other one having Y sampled at 13.5 MHz, Cb not being samples and Cr sampled at 6.75 MHz. When Y is regarded as 4, it becomes the repetition of 4:2:0 and 4:0:2.

Figure 1:
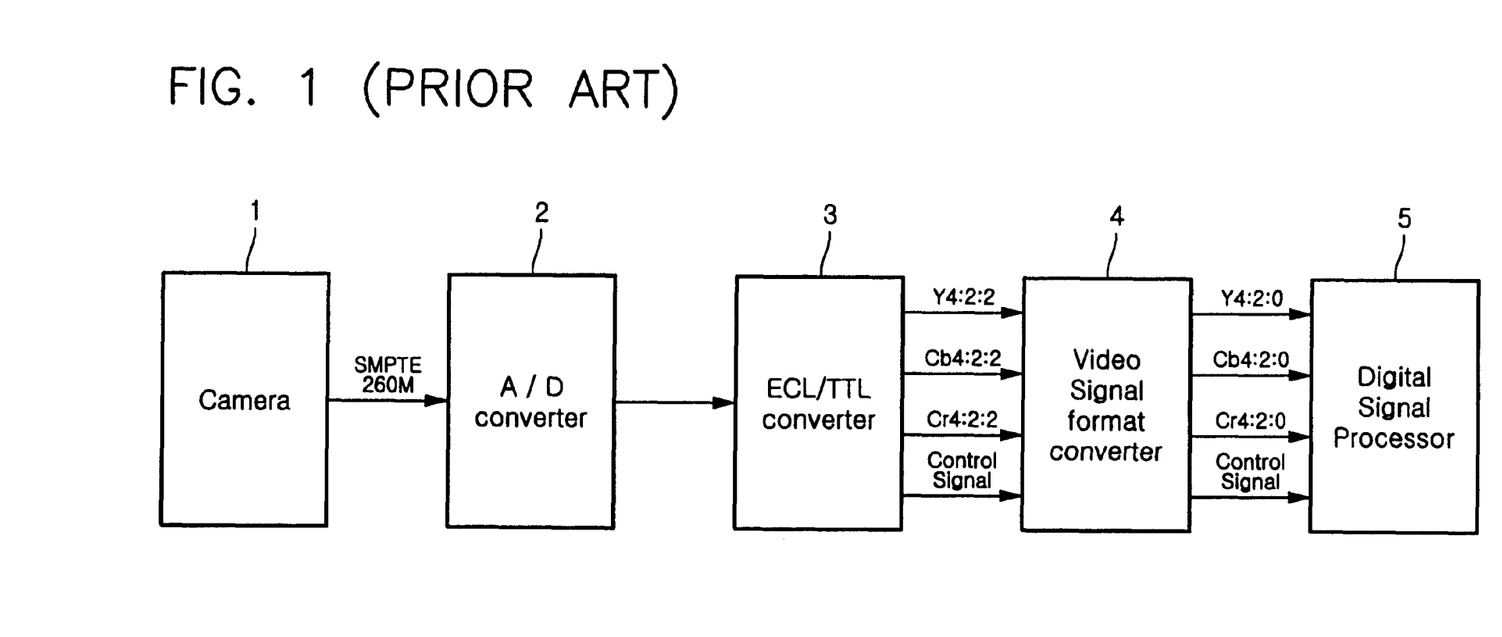
FIG. 1 is a block diagram of a conventional SMPTE260M signal interfacing.

FIG. 1 shows a conventional interface device for compressing a 4:2:2 signal into 4:2:0 signal. Referring to FIG. 1, a signal SMPTE260M from a camera 1 is converted by an analog/digital converter 2 into a 4:2:2 digital video signal, having luminance signal Y and chrominance signals Cb and Cr. Luminance signal Y is converted into 8-bit digital signal, and sent to a ECL/TTL converter 3. Chrominance signals Cb and Cr are alternately converted into 8-bit digital signals, and sent to ECL/TTL converter 3. ECL/TTL converter 3 changes the level of the digital signal from an emitter coupled logic level to transistor logic level, and generates a control signal. 4:2:2 video signal produced by ECL/TTL converter 3 is sent to a video signal format converter 4, which converts the signal into a 4:2:0 video signal, and then sends the signal to a digital signal processor 5. The control signal generated by ECL/TTL converter 3 is sent to digital signal processor 5 by way of the video signal format converter.

The above-described conversion process, converting the 4:2:2 formatted video signal into the 4:2:0 formatted video signal, is called decimation. A typical decimation filter is disclosed in U.S Pat. No. 5,170,368, which was designed to able to change the decimation ratio.

Figure 2:
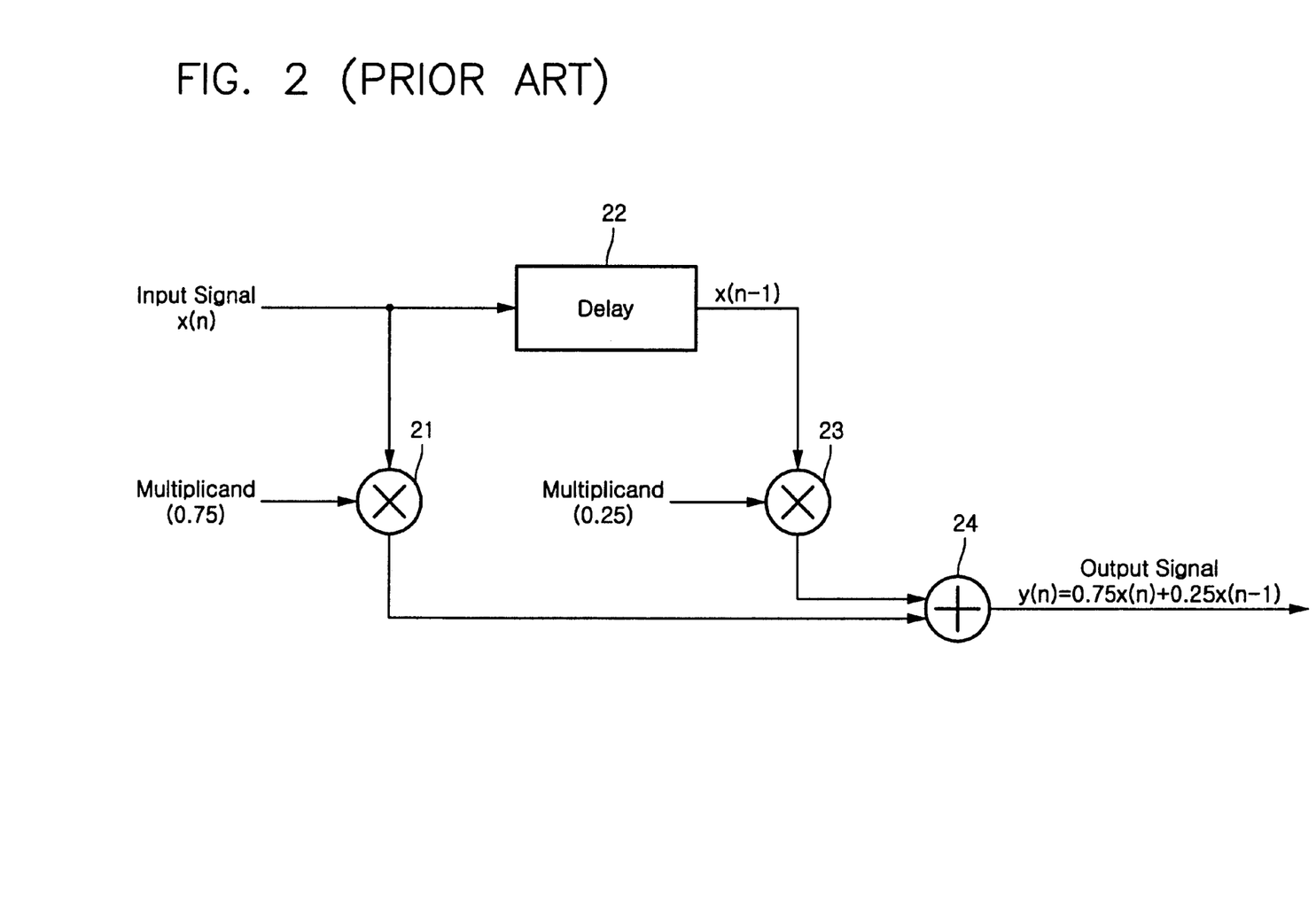
FIG. 2 is a block diagram of a 2-stage FIR filter used in a conventional SMPTE260M signal interface.

A FIR filter is used to reduce aliasing effect generated during down-sampling of a video signal in the decimation process. This FIR filter is often used when the decimation of the chrominance signal is accomplished using hardware. FIG. 2 shows a conventional FIR filter. Referring to FIG. 2, the FIR filter includes: a first multiplier 21, for multiplying the input signal x(n) by a first predetermined multiplication factor (0.75); a delay 22, for delaying the input signal x(n) for a predetermined time; a second multiplier 23, for multiplying the signal x(n−1) output from delay 22 by a second predetermined multiplication factor (0.25); and an adder 24, for adding the signals from first and second multipliers 21 and 23.

Figure 3A:
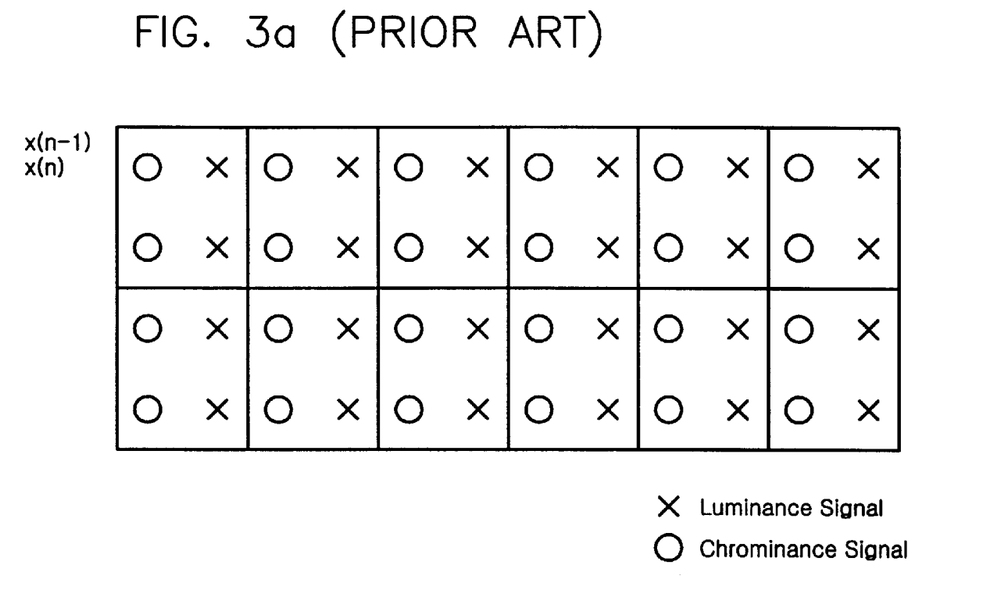
FIG. 3A shows one frame of a motion picture, indicating the location of luminance signal and chrominance signals in 4:2:2 format.
Figure 3B:
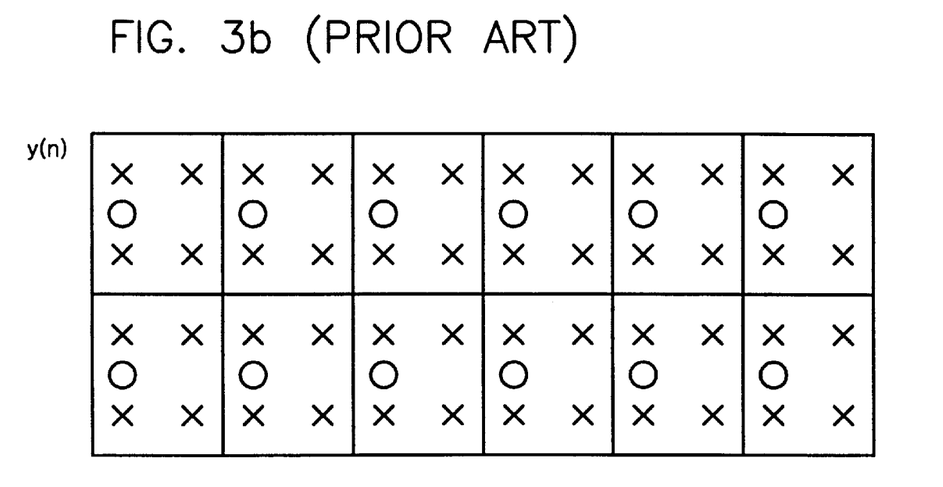
FIG. 3B shows one frame of a motion picture, indicating the location of luminance signal and chrominance signals in 4:2:0 format.

First multiplier 21 of the 2-stage FIR filter multiplies 4:2:2 formatted video signal x(n), shown in FIG. 3A, by the factor of 0.75. Delay 22 delays signal x(n) output from the first multiplier for a predetermined time in the vertical direction, and outputs the delayed 4:2:2 formatted chrominance signal x(n−1) to second multiplier 23. Second multiplier 23 multiplies the delayed chrominance signal x(n−1) by the factor of 0.25 in the vertical direction. Adder 24 adds the signals from first and second multipliers 21 and 23, and outputs a 4:2:0 formatted signal y(n) as shown in FIG. 3B. This can be represented as a formula, y(n)=0.75x(n)+0.25x(n−1), where y(n) is a 4:2:0 formatted signal, x(n) is a 4:2:2 formatted signal, and x(n−1) is a 4:2:2 format signal delayed in the vertical direction.

However, since the aforementioned conventional 2-stage FIR filter employs two multipliers, its configuration is complicated, and the calculations take a long time.

SUMMARY OF THE INVENTION

Accordingly, the present invention is directed to a decimation filter that substantially obviates one or more of the problems due to limitations and disadvantages of the related art.

An object of the present invention is to provide a 2-stage finite impulse response filter having a simple configuration and fast operation speed.

Another object of the present invention is to provide a 2-stage finite impulse response filter configured of adders and bit shift register.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the decimation filter includes: a first adder for adding an input signal to itself; a delay for delaying the input signal a predetermined time; a second adder for adding the input signal to the output signal of the delay; a third adder for adding the output signal of the first adder to the output signal of the second adder; and a bit shift register for shifting the output of the third adder a predetermined number of bits.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF PREFERRED EMBODIMENT

Reference will now be made in detail to the preferred embodiments of the present invention, examples of which are illustrated in the accompanying drawings.

Figure 4:
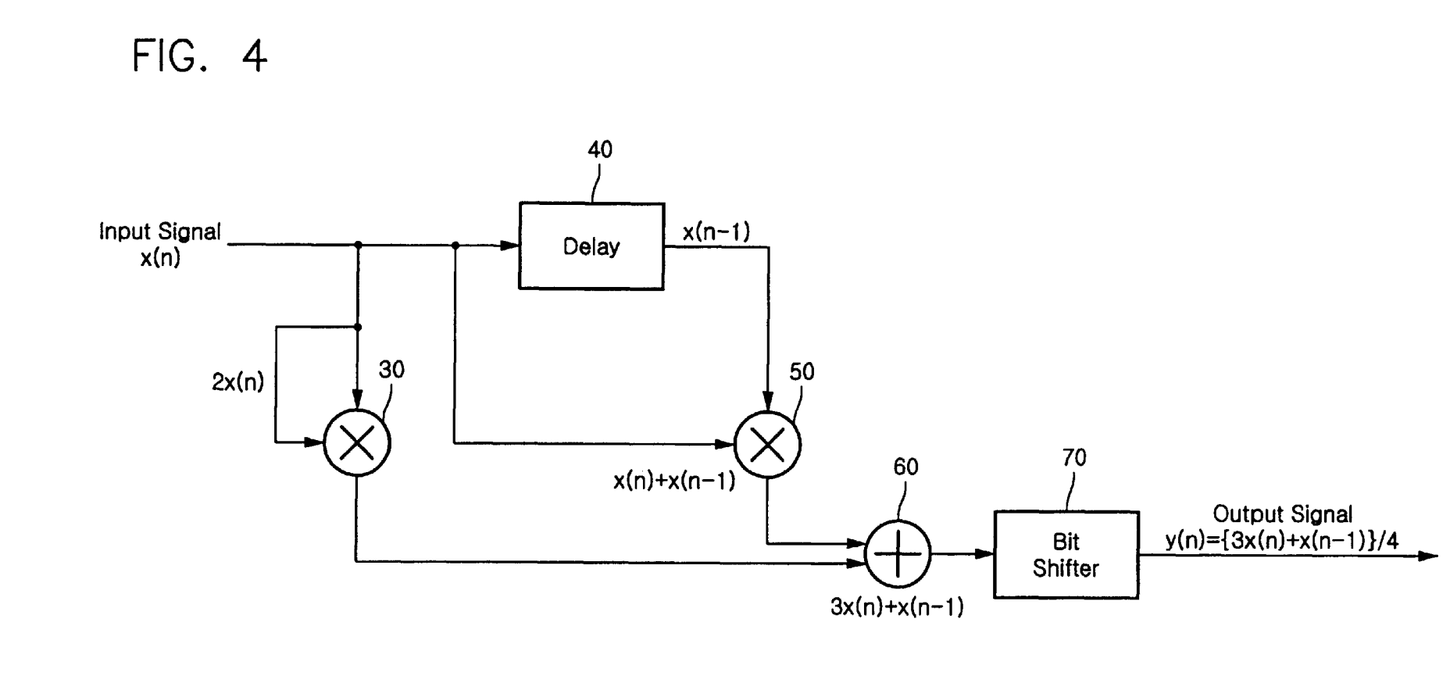
FIG. 4 is a block diagram of a decimation filter according to the present invention.

FIG. 4 is a block diagram of a decimation filter according to the present invention. Referring to FIG. 4, a first adder 30 receives a digital video x(n) signal as both of its two input signals, adds the two input signals, and outputs signal 2x(n). A delay 40 delays digital video signal x(n) by one period, and sends the delayed signal to a second adder 50. Second adder 50 adds digital video signal x(n−1), delayed by one period by delay 40, to digital video signal x(n), and outputs the combined signal to a third adder 60. Third adder 60 adds output signal 2x(n) of first adder 30 to output signal x(n)+x(n−1) of second adder 50, and sends resultant signal 3x(n)+x(n−) to a bit shift register 70. Bit shift register 70 shifts signal 3x(n)+x(n−1), from third adder 60, two bits to the right, thus dividing the shifted signal by $2^2$, which produces the signal y(n)={3x(n)+x(n−1)}/4.

Referring to FIG. 1, 4:2:2 formatted video signal is sent to video signal format converter 4. Luminance signal Y, not passing through the decimation process, is sent to digital signal processor 5. Meanwhile, chrominance signals Cb and Cr are alternately sent to video signal format converter 4, to pass through the decimation process. Video information, represented by signal y(n), which passed through the decimation, and luminance signal Y, means alternate repetition of a line where signal Y is sampled at 13.5 MHz, signal Cb is sampled at 6.75 MHz, and signal Cr is not sampled, and line where signal Y is sampled at 13.5 MHz, signal Cb is not sampled, and signal Cr is sampled at 6.75 MHz. For example, when Y is 4, 4:2:0 and 4:0:2 are alternately repeated.

Figure 5:
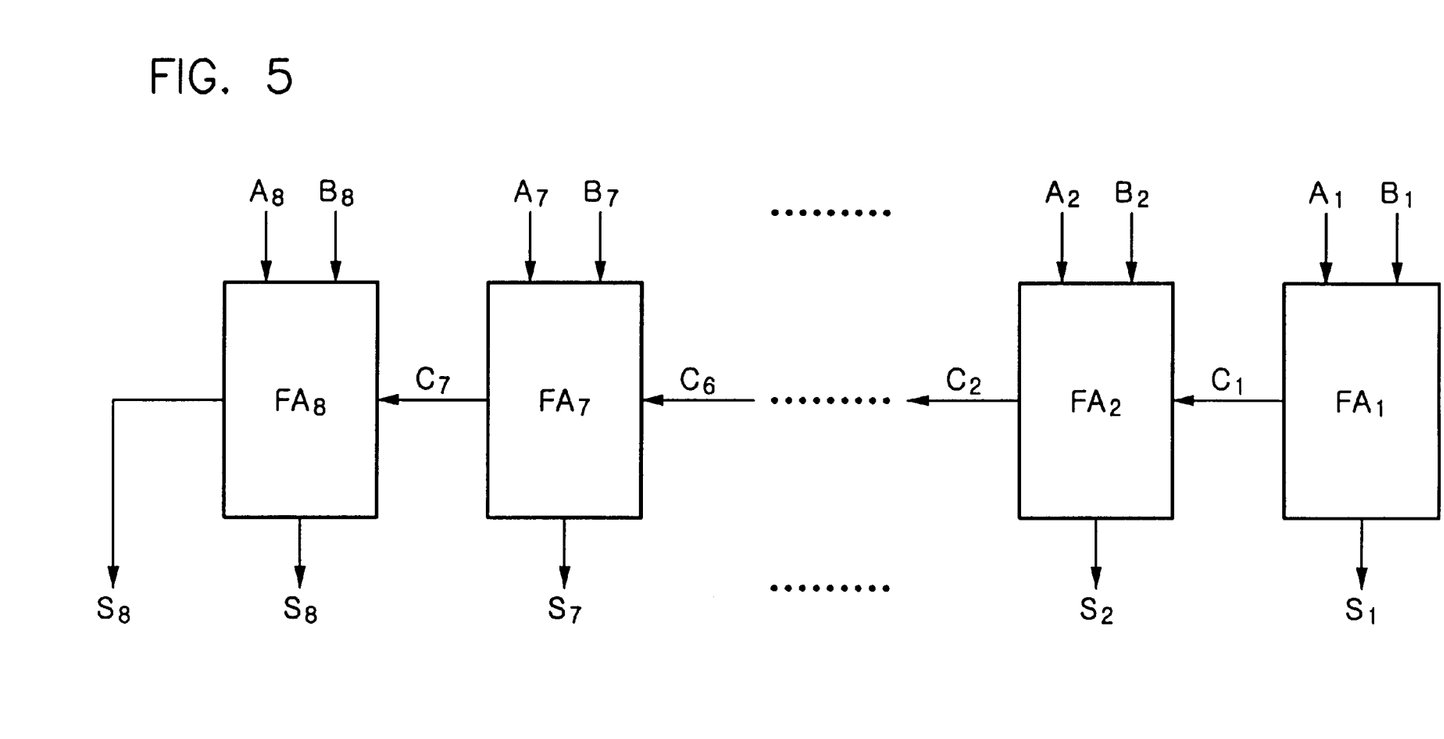
FIG. 5 is a block diagram of an 8-bit adder for adding two 8-bit binary numbers.

Digital signal x(n) including information of chrominance signal Cb or Cr is received by first adder 30, second adder 50 and delay 40. First adder 30 receives digital signal x(n) as both of its two input signals, adds the two signals, and outputs resultant 2x(n) signal. FIG. 5 shows an 8-bit adder adding two 8-bit binary numbers. An adder FA1 adding least significant bits A1 and B1 may be configured of a half adder, and other seven adders FA2 to FA8 are configured of full adders. Two 8-bit binary numbers, A1–A8 and B1–B8, are entered into each of eight adders FA1 to FA8. Each of adders, FA1 to FA8, adds the 8-bit binary numbers and outputs resultant values, S1 to S8.

Delay 40 receives digital signal x(n), delays it by one sampling period, producing delayed digital signal x(n−1). Second adder 40 adds digital signal x(n) to the delayed signal x(n−1) from delay 40, creating signal x(n)+x(n−1). Second adder 40 also has the configuration of an 8-bit adder. Third adder 60 adds the signal 2x(n) from first adder 30 to the signal x(n)+x(n−1) from second adder 50, producing the signal 3x(n)+x(n−1). Third adder 60 should be able to add two 9-bit binary numbers because signals 2x(n) and x(n)+x(n−1) may be 9-bits wide. Accordingly, third adder 60 is configured of nine full adders as shown in FIG. 5.

Figure 6:
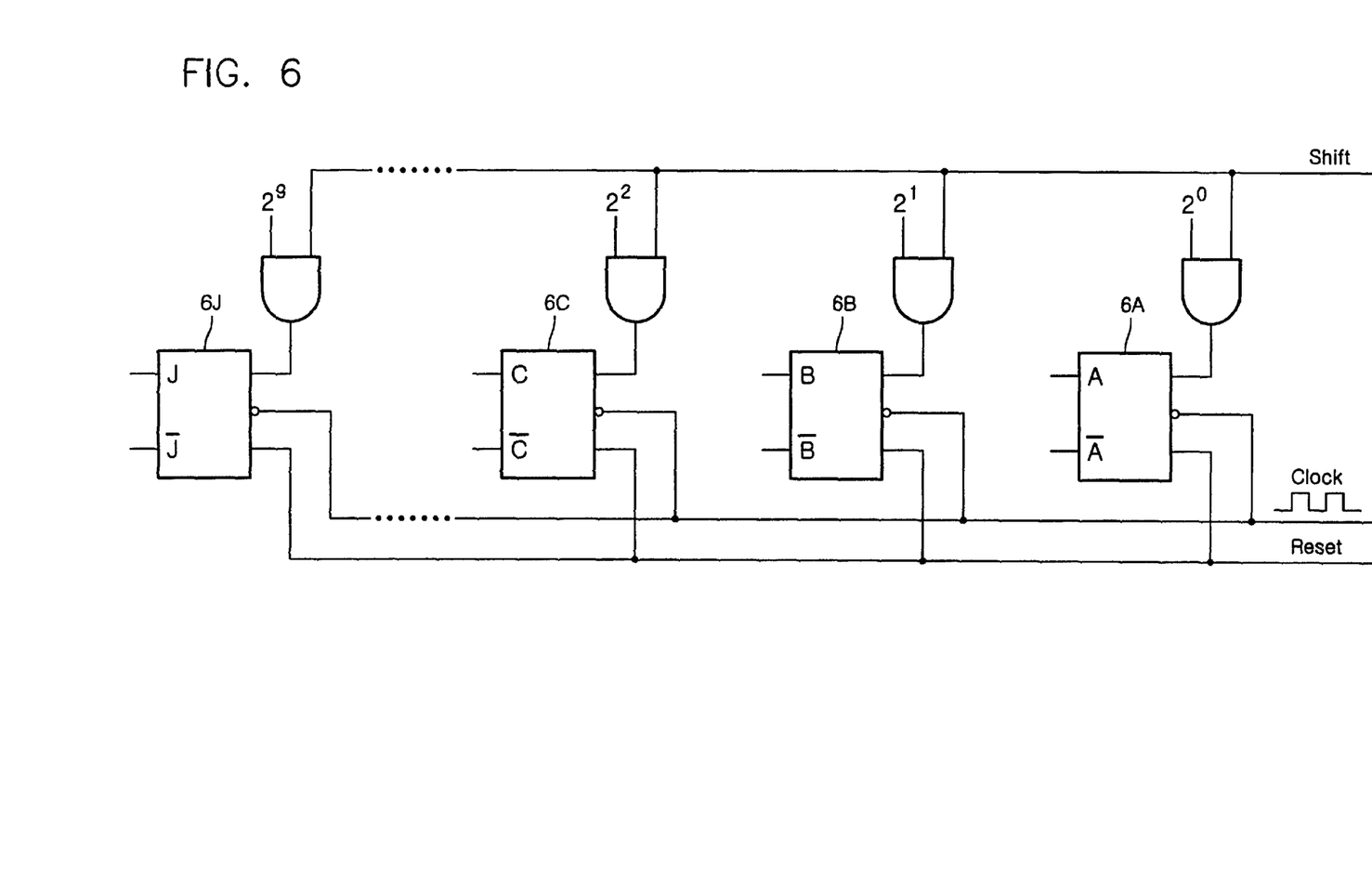
FIG. 6 is a block diagram of a 10-stage parallel input/parallel output shift register according to an embodiment of the present invention.

Bit shift register 70 shifts signal 3x(n)+x(n−1) from third adder 60 two bits to the right. Thus, bit shift register 70 can be configured of a 10-stage parallel input/parallel output shift register. When 10-bit data is produced by third adder 60 and stored in 10-stage flip-flop 6A to 6J, and eight bits $2^2$ to $2^9$ of the 10-bit data, other than two least significant bits $2^0$ and $2^1$, are shifted to obtain outputs C–J of 10-stage flip-flop 6C–6J, this output is the same as the value taken by dividing the 10-bit data by $2^2$ and rounding down the resultant value. That is, outputs C–J are the same as the value obtained by shifting the 10-bit data by two bits to the right, and rounding down the shifted value. Even though the value is round down, it does not affect the actual picture because the outputs are values of the chrominance signal.

Figure 7:
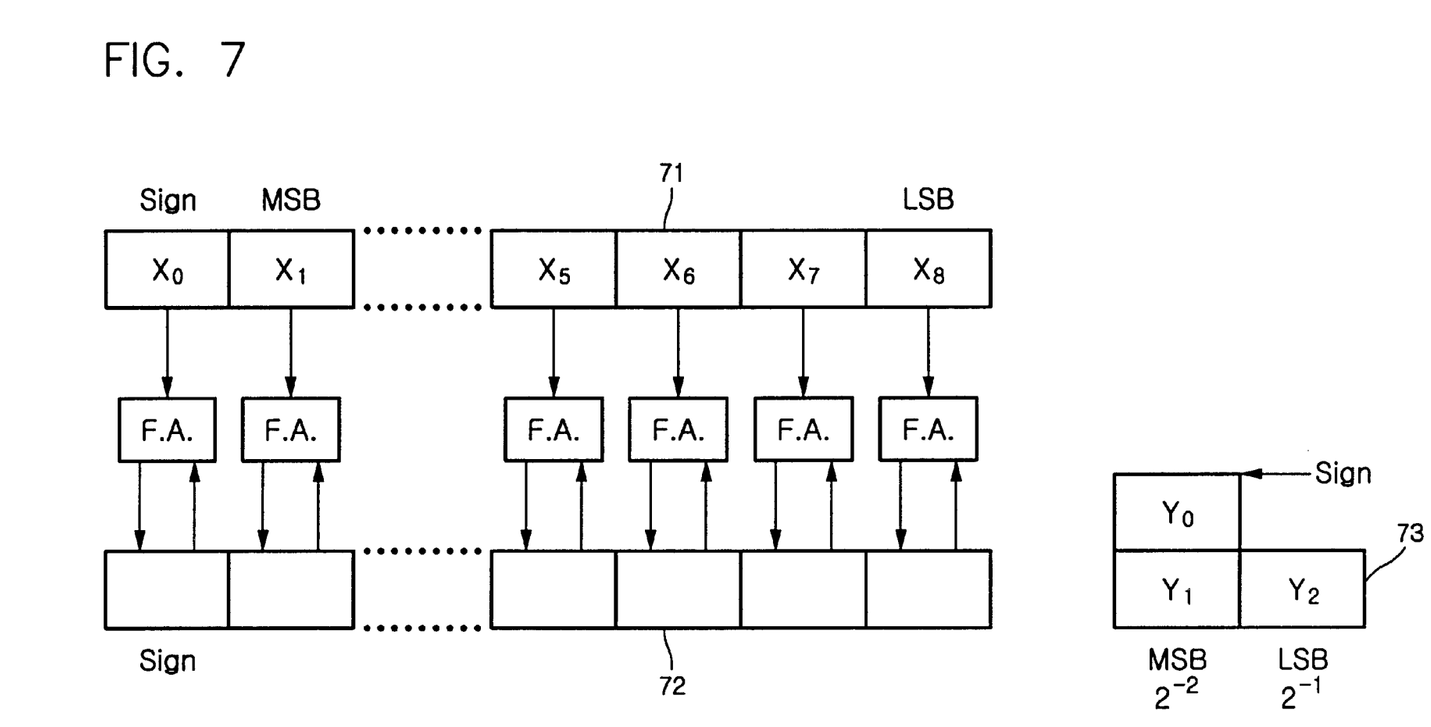
FIG. 7 shows a multiplier used in a conventional decimation filter.

FIG. 7 shows an example of multiplier of a conventional decimation filter. Referring to FIG. 7, a multiplicand, that is, chrominance signal data, is stored in a multiplicand register 71, a multiplier is stored in a register 73, and the result of multiplication is stored in an accumulator 72. A multiplier of 0.75 is represented as binary number of $0.11_2$, and 8-bit data is multiplied by the binary number. The configuration of this multiplier requires at least a 8-bit multiplicand register, one 2-bit multiplier register, one accumulator and eight full adders.

The conventional decimation filter needs two multipliers and one adder, thus requiring two 8-bit multiplicand registers, two 2-bit multiplier registers, two accumulators, 16 full adders (eight for each multiplier), and adders (at least eight full adders). In comparison, the decimation filter of the present invention requires first and second adders 30 and 50 configured of eight full adders, third adder 60 configured of nine full adders, and bit shift register 70 configured of a 10-stage register. The delay is not included because it is common. That is, in contrast to the conventional decimation filter which requires 20 registers (one bit requires one register), two accumulators, and 24 full adders, the decimation filter of the present invention needs 25 full adders and 10 registers. Furthermore, since additional devices are required to control the above-described devices, the configuration of a filter consisting of a large number of elements becomes more complicated.

According to the present invention, it is possible to create a decimation filter with a simplified configuration. Accordingly, the number of elements constructing the filter is reduced, and thus the cost decreases. Moreover, since the number of its fabrication process steps is also reduced, the productivity increases. This decrease the time required for calculation, producing a high-speed device.

It will be apparent to those skilled in the art that various modifications and variations can be made in the decimation filter of the present invention without departing from the spirit or scope of the invention. Thus, it is intended that the present invention cover the modifications and variations of this invention provided they come within the scope of the appended claims and their equivalents.

What is claimed is:

1. A decimation filter comprising:
   a first adder for adding an input signal to itself;
   a delay for delaying the input signal a predetermined time;
   a second adder for adding the input signal to the output signal of the delay;
   a third adder for adding the output signal of the first adder to the output signal of the second adder; and
   a bit shift register for shifting the output of the third adder a predetermined number of bits.

2. The decimation filter as claimed in claim 1, wherein each of the first, second and third adders contains a half adder and full adder, the half adder adding the least significant bit of data, the full adder adding the remaining bit.

3. The decimation filter as claimed in claim 1, wherein the first and second adders are configured to add 8-bit data, and third adder is configured to adds 9-bit binary number.

4. The decimation filter as claimed in claim 1, wherein the bit shift register is configured as a shift register which receives 10-bit data in parallel, shifts the data by a predetermined number of bits to the right, and outputs the shifted data in parallel.

5. The decimation filter as claimed in claim 1, wherein the bit shift register stores the data produced by the third adder and shifts the eight bits of the data other than two least significant bits.

6. The decimation filter as claimed in claim 1, wherein the bit shift register stores the data produced by the third adder, and shifts the output of the third adder by two bits to the right.

7. The decimation filter as claimed in claim 1, wherein the delay delays the input signal by one period.

* * * * *